United States Patent
Chao

(10) Patent No.: US 11,499,995 B2
(45) Date of Patent: Nov. 15, 2022

(54) LEAKAGE COMPENSATION TECHNIQUE FOR CURRENT SENSOR

(71) Applicant: Analog Devices, Inc., Norwood, MA (US)

(72) Inventor: Hio Leong Chao, Tempe, AZ (US)

(73) Assignee: Analog Devices, Inc., Norwood, MA (US)

( * ) Notice: Subject to any disclaimer, the term of this patent is extended or adjusted under 35 U.S.C. 154(b) by 199 days.

(21) Appl. No.: 17/079,845

(22) Filed: Oct. 26, 2020

(65) Prior Publication Data
US 2022/0128605 A1 Apr. 28, 2022

(51) Int. Cl.
| | |
|---|---|
| *G01R 27/08* | (2006.01) |
| *G01R 19/00* | (2006.01) |
| *G01R 19/22* | (2006.01) |
| *H03M 1/12* | (2006.01) |
| *G01R 29/26* | (2006.01) |
| *G01R 31/00* | (2006.01) |
| *G01R 31/40* | (2020.01) |

(52) U.S. Cl.
CPC ......... *G01R 19/0023* (2013.01); *G01R 19/22* (2013.01); *H03M 1/12* (2013.01); *G01R 29/26* (2013.01); *G01R 31/00* (2013.01); *G01R 31/40* (2013.01)

(58) Field of Classification Search
CPC .... G01R 19/0023; G01R 19/22; G01R 31/00; G01R 29/26; G01R 31/40; H03M 1/12
See application file for complete search history.

(56) References Cited

U.S. PATENT DOCUMENTS

| | | | |
|---|---|---|---|
| 4,827,207 | A | 5/1989 | Chieli |
| 5,493,246 | A | 2/1996 | Anderson |

(Continued)

FOREIGN PATENT DOCUMENTS

| | | |
|---|---|---|
| CN | 102243260 | 11/2011 |
| CN | 106483366 | 3/2017 |

(Continued)

OTHER PUBLICATIONS

"TI Designs: Current Sensing With 1-mu-s Settling for 1-, 2-, 3-Shunt FOC Inverter Reference Design", Texas Instruments Inc., (Mar. 2017), 47 pgs.

(Continued)

*Primary Examiner* — Joseph J Lauture
(74) *Attorney, Agent, or Firm* — Schwegman Lundberg & Woessner, P.A.

(57) ABSTRACT

A current sensor circuit comprises multiple resistive circuit elements of different values of electrical resistance arranged between at least one input terminal of the current sensor circuit and an output terminal; a first plurality of switching circuits coupled between the input terminal and the resistive circuit elements, wherein each switching circuit of the first plurality of switching circuits includes a pair of transistors connected in series; at least one drive amplifier including an output and an input connected to the output terminal; and a second plurality of switching circuits, each switching circuit including a first switch terminal coupled to the at least one drive amplifier output and a second switch terminal coupled to a common connection of a pair of transistors of the first plurality of switching circuits.

20 Claims, 9 Drawing Sheets

(56) References Cited

U.S. PATENT DOCUMENTS

| | | | |
|---|---|---|---|
| 5,530,612 | A | 6/1996 | Maloney |
| 7,461,285 | B2 | 12/2008 | Nervegna |
| 8,044,650 | B2 | 10/2011 | Tang et al. |
| 8,570,090 | B2 | 10/2013 | Gist, III et al. |
| 8,779,777 | B2 | 7/2014 | Irmer et al. |
| 9,088,256 | B2 | 7/2015 | Cosgrave et al. |
| 9,304,152 | B2 | 4/2016 | Aerts |
| 9,360,879 | B2 * | 6/2016 | Levhar ................ G05F 3/02 |
| 9,413,160 | B2 | 8/2016 | Gao et al. |
| 9,444,414 | B2 | 9/2016 | Peluso |
| 9,465,057 | B2 | 10/2016 | Aerts |
| 9,500,678 | B2 | 11/2016 | Williams |
| 9,689,900 | B1 | 6/2017 | Chikamatsu |
| 9,733,284 | B2 | 8/2017 | Igarashi et al. |
| 9,971,374 | B2 | 5/2018 | Joos et al. |
| 2007/0200538 | A1 | 8/2007 | Tang et al. |
| 2018/0321349 | A1 | 11/2018 | Qu et al. |

FOREIGN PATENT DOCUMENTS

| | | |
|---|---|---|
| JP | H11281677 | 10/1999 |
| JP | 2012220399 | 11/2012 |
| JP | 2015153382 | 8/2015 |

OTHER PUBLICATIONS

"International Application Serial No. PCT/US2021/051736, International Search Report dated Jan. 10, 2022", 5 pgs.

"International Application Serial No. PCT/US2021/051736, Written Opinion dated Jan. 10, 2022", 6 pgs.

* cited by examiner

LEAKAGE COMPENSATION TECHNIQUE FOR CURRENT SENSOR

FIELD OF THE DISCLOSURE

This document relates to electronic circuits for monitoring current of an electronic system.

BACKGROUND

A current monitoring circuit is used to monitor and report the load current information of an electronic system. In some systems, it is required to report the load current information with high accuracy over a wide current range that can span multiple magnitude decades. A current sensor circuit typically includes a sense resistor and a current sense amplifier to produce an output signal. The current through the sense resistor is measured by observing the voltage developed across the sense resistor through the current sense amplifier's inputs. Due to Ohm's law, the voltage across the resistor terminals is proportional to the current though the resistor. A source of error for a current sensor circuit is offset error caused by finite open loop-gain and mismatch of devices of the current monitoring circuit.

SUMMARY OF THE DISCLOSURE

This document relates generally to electronic circuits for monitoring current. In some aspects, a current sensor circuit includes multiple resistive circuit elements of different values of electrical resistance arranged between at least one input terminal of the current sensor circuit and an output terminal; a first plurality of switching circuits coupled between the input terminal and the resistive circuit elements, wherein each switching circuit of the first plurality of switching circuits includes a pair of transistors connected in series; at least one drive amplifier including an output and an input connected to the output terminal; and a second plurality of switching circuits, each switching circuit including a first switch terminal coupled to the at least one drive amplifier output and a second switch terminal coupled to a common connection of a pair of transistors of the first plurality of switching circuits.

In some aspects, a method of operating a current monitoring includes connecting a first resistive circuit element, selected for monitoring current, between a first input terminal and an output terminal of the current monitoring circuit by activating a first pair of transistors that are connected to the first resistive circuit element, wherein the pair of transistors are connected in series; driving a common connection of transistor pairs connected to unselected resistive circuit elements with an output voltage of the output terminal, and sensing voltage across the selected first resistive circuit element.

In some aspects, an electronic system includes a first circuit supply rail, a circuit load, and a current monitor circuit coupled to the first circuit supply rail and circuit load. The current monitor circuit includes multiple resistive circuit elements of different values of electrical resistance arranged between at least one input terminal of the current sensor circuit and an output terminal; a first plurality of switching circuits coupled between the at least one input terminal and the resistive circuit elements, wherein each switching circuit of the first plurality of switching circuits includes a pair of transistors connected in series with drain regions of the transistors connected together; at least one drive amplifier including an output and an input connected to the output terminal; a second plurality of switching circuits, each switching circuit including a first switch terminal coupled to the at least one drive amplifier output and a second switch terminal coupled to a common drain connection of a pair of transistors of the first plurality of switching circuits; and a sense amplifier configured to provide an output signal representative of at least a portion of load current to the output terminal.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

A current sensor circuit is used to monitor current supplied to an electronic system. A source of error for a current sensor circuit is offset error caused by finite open loop-gain and devices mismatch. When the input signal is small, the type of error that contributes most to the output accuracy is the offset error of the current sense amplifier. When the input signal is large relative to the offset error, the output accuracy improves because of the larger signal to noise ratio.

A multi-ranging current monitor circuit can sense current over a wide input range with good accuracy. A multi-ranging current monitor circuit uses multiple shunt resistors of various values for current measurement at different current levels. Depending on the level of the current, the appropriate shunt resistor is selected to conduct the current. Using multiple shunt resistors allows the current sense monitor circuit to maintain a good signal-to-noise ratio over a wide current range. This minimizes the effect of offset error to the current monitor's output when the input signal becomes too small.

Figure 1:
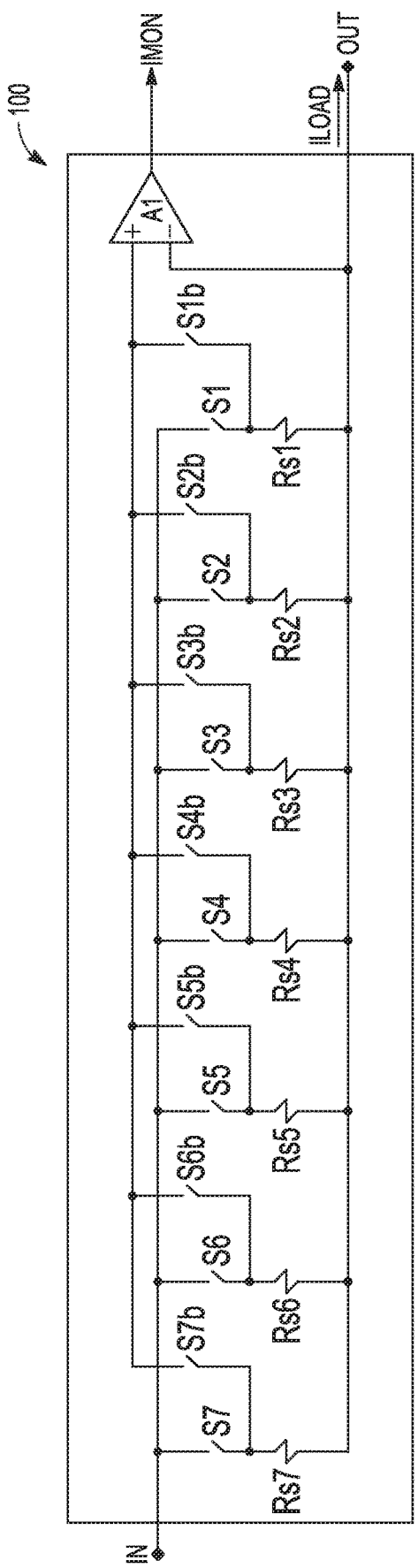
FIG. 1 is a schematic of an example of a multi-ranging current monitor circuit.

FIG. 1 is a schematic of an example of a multi-ranging current monitor circuit 100. The circuit consists of resistive circuit elements (e.g., shunts resistors) Rs1 to Rs7 for conducting the current (iload) from the input terminal (IN) through switches (S1 to S7) to the output terminal (OUT). The resistive circuit elements can be resistors, integrated resistors, or active devices (e.g., transistors). Sense amplifier (A1) senses the voltages across the shunt resistors to provide an output that is indicative of the magnitude and polarity of the current. This is achieved by connecting the inverting input of the sense amplifier A1 to the bottom of the shunt resistors and the OUT terminal, and by connecting the non-inverting input to the top of one the shunt resistors through switches (S1b to S7b). The series switches (S1-S7) are connected to a common input circuit node (the IN terminal) and the resistive circuit elements.

The IN terminal of the current sensor circuit 100 can be driven by a low impedance source such as a voltage regulator. It might also be connected to a high output impedance node such as a current source. The output terminal of the current sensor circuit can be connected to a circuit load, for example, for load current monitoring purposes. Some examples of a circuit load include an electric motor or a battery (e.g., for charging). When a load is connected to the output terminal, the load current (iload) flows into the load through the one of the shunt resistors, and the information relating to the load current such as magnitude and polarity is reported through the current monitor terminal (IMON). The output of the current monitor circuit (at IMON) can be in the form of current, voltage, digital value, etc.

In the example current sensor circuit of FIG. 1, there are seven resistors responsible for measuring load current between a positive 2.5 Amps (2.5 A) and a negative −2.5 A. Table 1 shows an example of shunt resistors values (in Ohms) and current ranges (in Amps) for the shunt resistors.

TABLE 1

| Resistor | Resistance Value | Current Range |
| --- | --- | --- |
| Rs1 | 20 kΩ | −5 μA to 5 μA |
| Rs2 | 4 kΩ | −25 μA to −5 μA and 5 μA to 25 μA |
| Rs3 | 400 Ω | −250 μA to −25 μA and 25 μA to 250 μA |
| Rs4 | 40 Ω | −2.5 mA to −250 μA and 250 μA to 2.5 mA |
| Rs5 | 4 Ω | −25 mA to −2.5 mA and 2.5 mA to 25 mA |
| Rs6 | 400 mΩ | −250 mA to −25 mA and 25 mA to 250 mA |
| Rs7 | 40 mΩ | −2.5A to −250 mA and 250 mA to 2.5 A |

Each shunt resistor is designed to handle a specific range of current with a full-scale voltage of 100 millivolts (100 mV). A full scale of 100 mV is used by this current monitor circuit in consideration of the conduction loss and accuracy. A higher full-scale voltage will result in better accuracy because of higher signal-to-noise ratio, but at the same time will suffer from higher conduction loss because of the larger voltage drop across the shunt resistor.

In normal operation, a current enters the current monitor circuit through the IN terminal. Then, it flows through one of the shunt resistors and leaves the circuit through the OUT terminal. The current leaving the OUT terminal is referred to as "iload." The switches (S1-S7 and S1b-S7b) are controlled by a separate control circuit not shown in FIG. 1. During operation, one of the switches (S1-S7) will be closed, connecting the corresponding shunt resistor to the IN terminal. The switches (S1b-S7b) connect the positive input of sense amplifier A1 to the selected shunt resistor. The state of the switches (S1-S7 and S1b-S7b) can be changed manually by user inputs or changed automatically by the control circuit based on the information of the current (iload). Sense amplifier A1 senses the voltage across the selected shunt resistor and outputs a signal at terminal IMON that is indicative of the magnitude and polarity of the current iload.

In some applications where high current measurement accuracy is required through the entire current range, the accuracy at the low current range can be limited by the leakage current of the series switches (S1-S7). This is because the series switches need to be sized large enough to conduct the full-scale current for each range, and when they are off, the leakage currents of those off switches contribute to the iload current and affect the current monitor output.

As an example to illustrate the issue with the leakage current of the switches, assume a 5 microamp (5 uA) current is flowing switch S1 and through resistor Rs1 (20 kilo-ohms, 20 kΩ). Assuming the on resistance of S1 is negligible, then the voltage difference between the IN terminal and OUT terminal is 100 mV. The series switches (S2-S7) are off and the voltage across the shunt resistors (Rs2-Rs7) is 0V. This means that the series switches (S2-S7) see 00 mV across between their drain and source terminals. Although all the series switches (S2-S7) can have leakage current, most of the leakage current comes from S7, which is the highest current range and therefore is the largest device in terms of area. The leakage current increases exponentially with temperate due to generation of carriers in the space-charge region. The leakage current is also a function of the reverse bias voltage.

Figure 2:
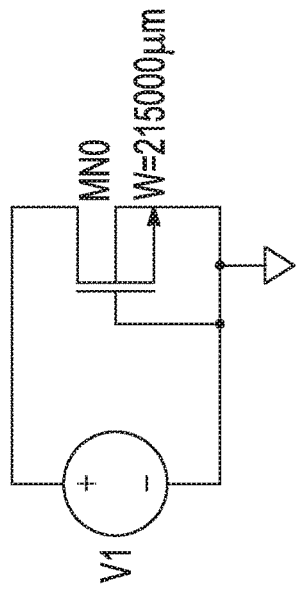
FIG. 2 is a schematic of a circuit used to simulate leakage current.

FIG. 2 is a schematic of a circuit used to simulate temperature dependency of leakage current. The device used in the simulation is an n-type metal oxide semiconductor (NMOS) device with its source, body, and gate connected to ground. The drain of the NMOS is connected to voltage source V1. By connecting the source, body, and gate together, the NMOS device is operating in the off region. The NMOS device is sized for a 2.5 A maximum current, which has the same current handling capability as the switch (S7) in the circuit example of FIG. 1.

Figure 3:
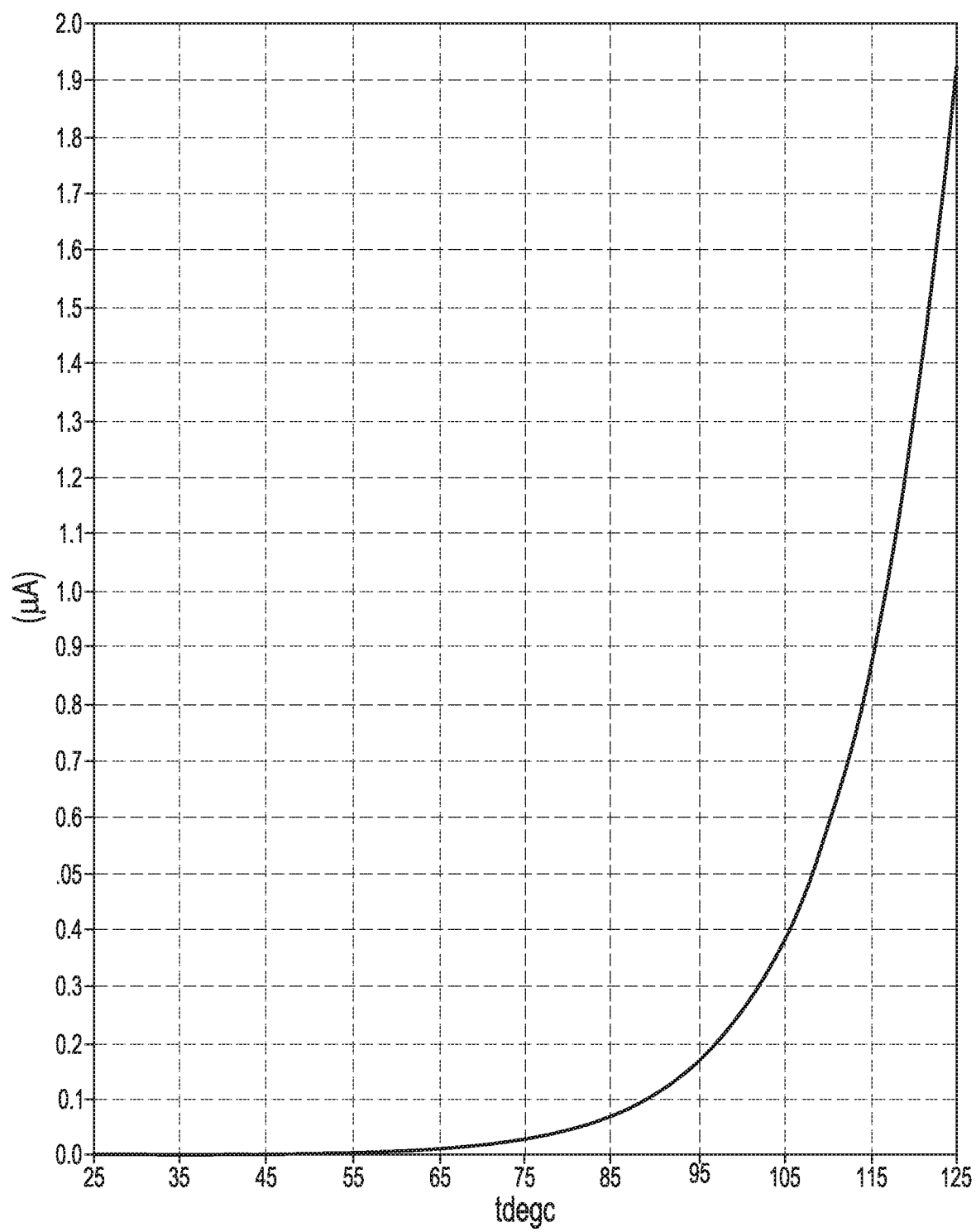
FIG. 3 is a graph of simulation results of leakage current vs. temperature of the circuit in FIG. 2.

FIG. 3 is a graph of simulation results of leakage current vs. temperature of the NMOS device in FIG. 2. The voltage source V1 is set to 100 millivolts (100 mV) and the temperature is swept during the simulation.

Figure 4:
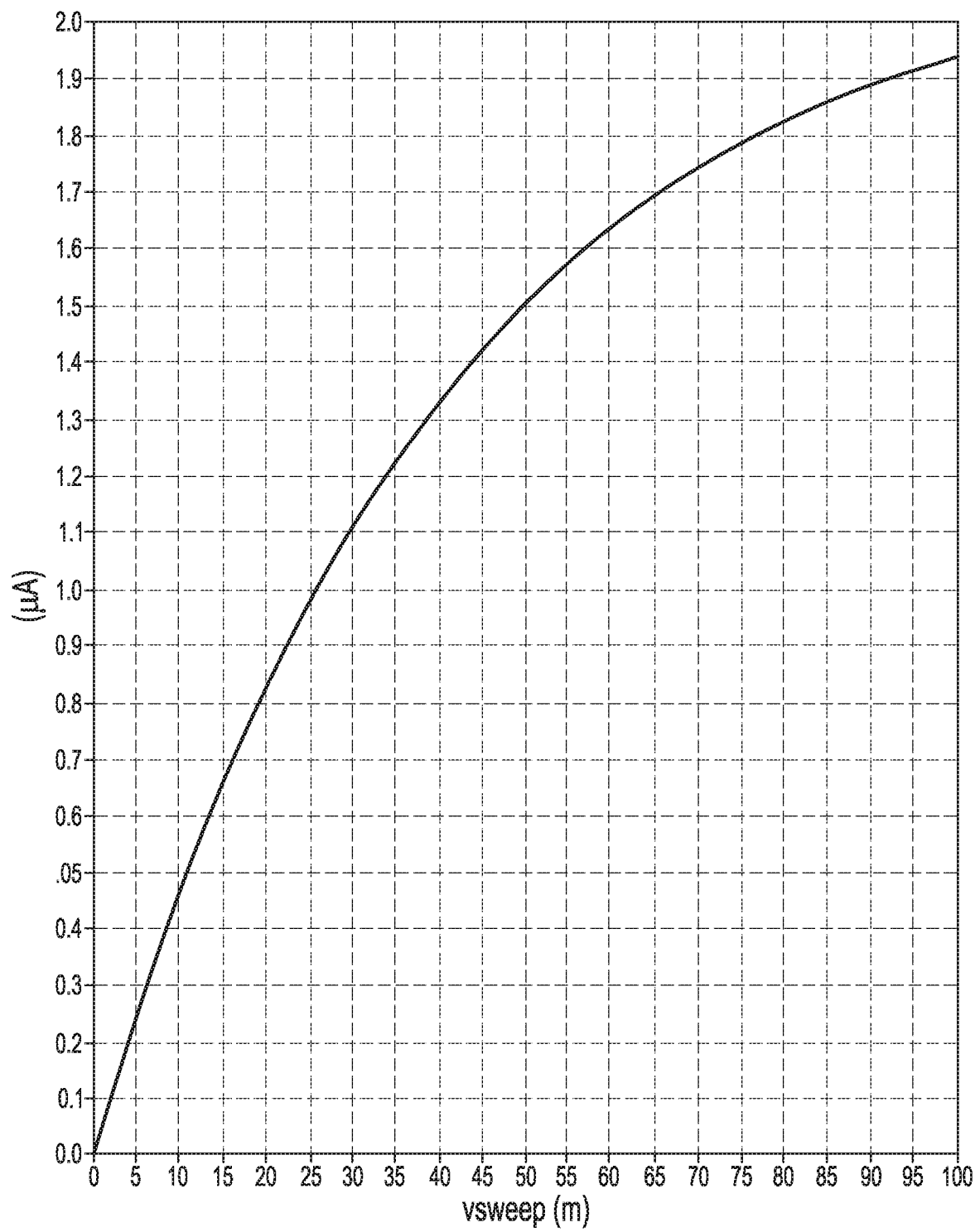
FIG. 4 is a graph of simulation results of leakage current vs. drain-source voltage of the circuit in FIG. 2 with temperature held constant.

FIG. 4 is a graph of simulation results of leakage current vs. drain-source voltage (Vds) with temperature constant at 125° C. Note that the leakage current is around 1.93 micro-Amps (1.93 μA) at 100 mV drain-source voltage, and the leakage current diminishes as the drain-source voltage approaches 0V.

Figure 5:
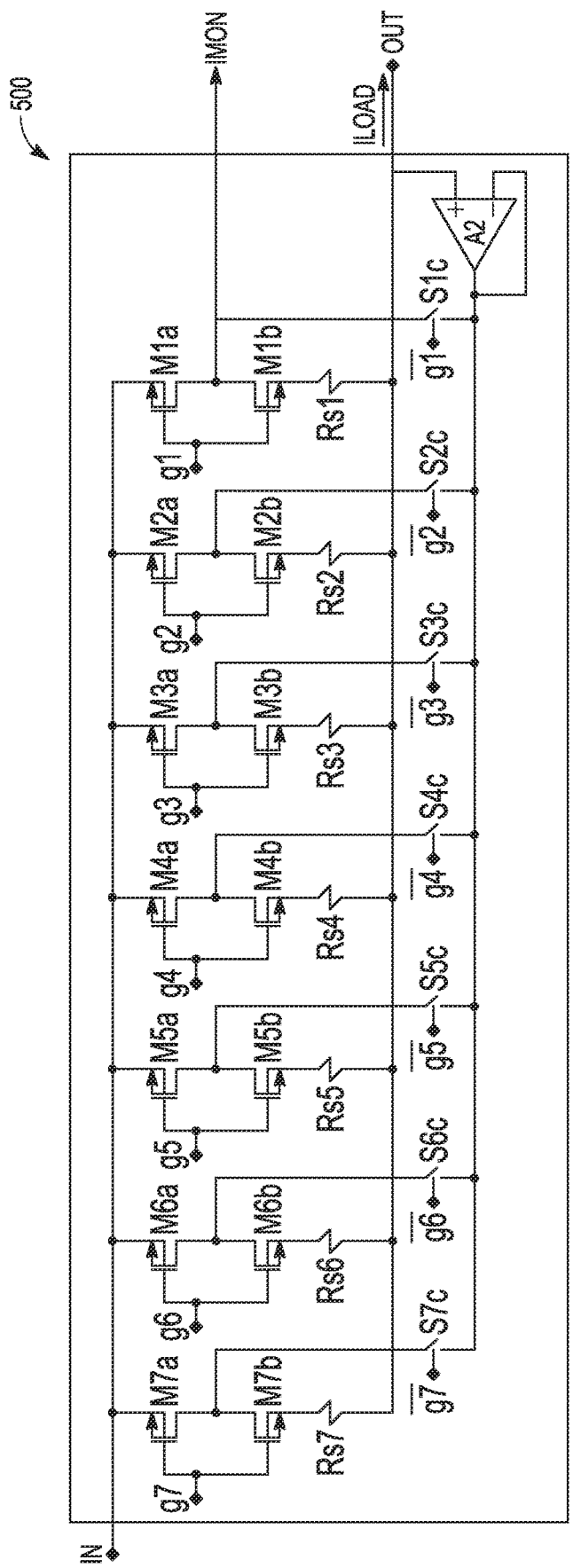
FIG. 5 is a circuit schematic of an example of a multi-ranging current sensor circuit.

FIG. 5 is a circuit schematic of an example of a multi-ranging current sensor circuit 500. The circuit includes an input terminal (IN), an output terminal (OUT), and a current monitor terminal (IMON). The circuit also includes multiple resistive circuit elements or resistors (e.g., shunt resistors Rs1 through Rs7). The resistive circuit elements may be any integrated device having a predetermined value of electrical resistance. To simplify the circuit, the circuitry that provides the IMON output (e.g., the sense amplifier and the switches that connect the sense amplifier to the resistors) is not shown in FIG. 5.

The circuit includes switching circuits to connect the shunt resistors Rs1-Rs7 to the IN terminal. The switching circuits are back-to-back connected NMOS devices M1a-M7a and M1b-M7b. The NMOS transistors in each back-to-back pair share the same drain connection and the same gate connection (labeled g1-g7). The gate voltages of the NMOS devices are driven high relative to the source voltages so that the NMOS devices turn on and form a low impedance path between the IN terminal and the shunt resistors. And when the gate-source voltages are driven low (less than the threshold voltage), the NMOS devices turn off to disconnect the shunt resistors from the IN terminal.

The shunt resistors are numbered according to their current handling capability with Rs7 being capable of sensing the highest current of the iload current range and Rs1 for sensing the lowest current. The back-to-back NMOS devices are controlled such that the iload current can only go through one of the shunt resistors. Drive amplifier A2 is configured in a unity gain configuration with its positive input connecting to the OUT terminal. Switches S1c-S7c each have a switch terminal connected to the output of drive amplifier A2 and another switch terminal connected to the common drains of the back-to-back NMOS devices. The control signals for switches S1c-S7c are complementary to the gate connections g1-g7 of the NMOS devices. This allows switches S1c-S7c to operate in the opposite state of the back-to-back NMOS devices (e.g., when NMOS device pair M7a and M7b are on, switch S7c is off).

In the example of FIG. 5, the back-to-back NMOS devices have a common drain connection. In variations, the back-to-back NMOS devices have a common source connection. In other variations the devices M1a-M7a and M1b-M7b are p-type metal oxide semiconductor (PMOS) devices with either a common drain connection or a common source connection. While the transistor pairs are shown with a common gate connection to activate a transistor pair, separate gate connections can be used to activate the transistors of a back-to-back connected pair. Also, while the example circuit in FIG. 5 shows one drive amplifier A2, multiple drive amplifiers may be coupled to the OUT terminal and used to drive the common connections of the transistor pairs.

When the iload current is in the highest current range, gate connection g7 is driven high. NMOS devices M7a and M7b turn on and conduct the iload current. NMOS devices M1a-M6a and M1b-M6b are turned off to block any current in the other shunt resistors Rs1-Rs6. Switches S1c-S6c are closed or active, connecting the output of drive amplifier A2 to the common connection of the back-to-back NMOS devices M1a-M6a and M1b-M6b. Drive amplifier A2 buffers the voltage at the OUT terminal node and drives the drains of the turned off NMOS devices M1b-M6b through switches S1c-S6c. Because the drain current of NMOS devices M1b-M6b is equal to the current in Rs1-Rs6, the source voltages of the NMOS devices (M1b-M6b) are at the voltage of the OUT terminal, and so are the drain voltages of the NMOS devices. This makes the drain-source voltages (Vds) of the NMOS devices M1b-M6b equal to 0V. As shown in FIG. 4, the drain-source (body) leakage current goes to 0 A as the Vds voltage approaches 0V. By driving the voltage of the drains to the voltage of the sources through drive amplifier A2, the leakage current is nullified and the currents in Rs1-Rs6 are 0 A. This means the current in Rs7 must equal the current iload. Although iload is in the highest current range where the current being sensed is the largest, leakage current coming from the NMOS (M1b-M6b) will not have much impact on the current monitor output IMON.

When the iload current is at the lowest current range, Rs1 conducts the iload current with NMOS devices M1a and M1b being on. NMOS devices M2a-M7a and M2b-M7b are off to block current flowing into the other shunt resistors Rs2-Rs7. Switches S2c-S7c are closed and the drains of M2b-M7b are driven by drive amplifier A2 to a voltage equal to the voltage at the OUT terminal. This allows the drain voltages of NMOS devices M2b-M7b to be equal to the source voltages and therefore the drain-source voltages (Vds) are equal to 0V. By making the drain-source voltages zero, the leakage current in NMOS devices M2b-M7b must be also zero, as illustrated by the drain-source dependency in the graph in FIG. 4.

When the iload current is positive, meaning the iload current flows into the IN terminal and out of the OUT terminal, the sources of NMOS devices M1a-M7a are at a higher potential than that of the drains (Vs>Vd). The voltage drop between the IN and OUT terminals depends on the on-resistance of the conducting back-to-back NMOS devices and the shunt resistors. The back-to-back NMOS devices in this circuit are sized such that the voltage across the drain and source when they are conducting at full-scale current of the corresponding current range is less than the forward bias voltage of the devices body diode. For a positive iload current, the voltage at the IN terminal will be higher than the node voltage at the OUT terminal. With the drive amplifier A2 driving the drains of the off NMOS devices M1b-M7b through switches S1c-S7c, the off NMOS devices M1a-M7a will see a voltage across its source and drain that is equal to the voltage difference between the IN and OUT terminals. It is important in the design to make sure the voltage drop from the IN terminal to the OUT terminal must not exceed the forward bias voltage of the body diode of M1a-M7a, otherwise the body diode of the off NMOS devices M1a-M7a will turn on and work against the drive provided with drive amplifier A2.

When the iload current is negative, meaning current flows into the OUT terminal and out of the IN terminal, the voltage at the IN terminal is lower than the voltage at the OUT terminal. The voltage difference between the IN and OUT terminals depends on the voltage drop across the conducting shunt resistor and the back-to-back NMOS device. With drive amplifier A2 working to keep the Vds of the off NMOS devices M1b-M7b to 0V, the Vds voltages of the off M1a-M7a NMOS devices are equal to the voltage drop from the OUT terminal to the IN terminal. Because the drain voltages of the off NMOS devices M1a-M7a are higher than the source voltages, the body diodes of those NMOS devices are reversed biased.

The leakage current compensation technique in FIG. 5 uses back-to-back connected NMOS devices to control the current through the shunt resistors. When a back-to-back connected NMOS device is off to cut off the current through a shunt resistor, drive amplifier A2 drives the Vds to the off NMOS devices (M1b-M7b) to 0V through switches Sic-S7c. Although in the discussion the switches S1-S7 of FIG. 1 are implemented using NMOS devices (M1a-M7a and M1b-M7b of FIG. 5), PMOS devices could be used instead. Other arrangements for the switches S1-S7 can also be used such as back-to-back NMOS devices with a common source connection to implement the leakage compensation technique. The current sensor circuit shown in FIG. 5 uses a single drive amplifier A2 to nullify the leakage current by driving the drain-source voltage of NMOS devices M1b-M7b to 0V. Multiple drive amplifiers could be used instead of a single drive amplifier A2 to achieve the same purpose. The shunt resistors in the current sensor circuit example of FIG. 5 could be resistive circuit elements integrated on chip or can be external discrete circuit components.

Figure 6:
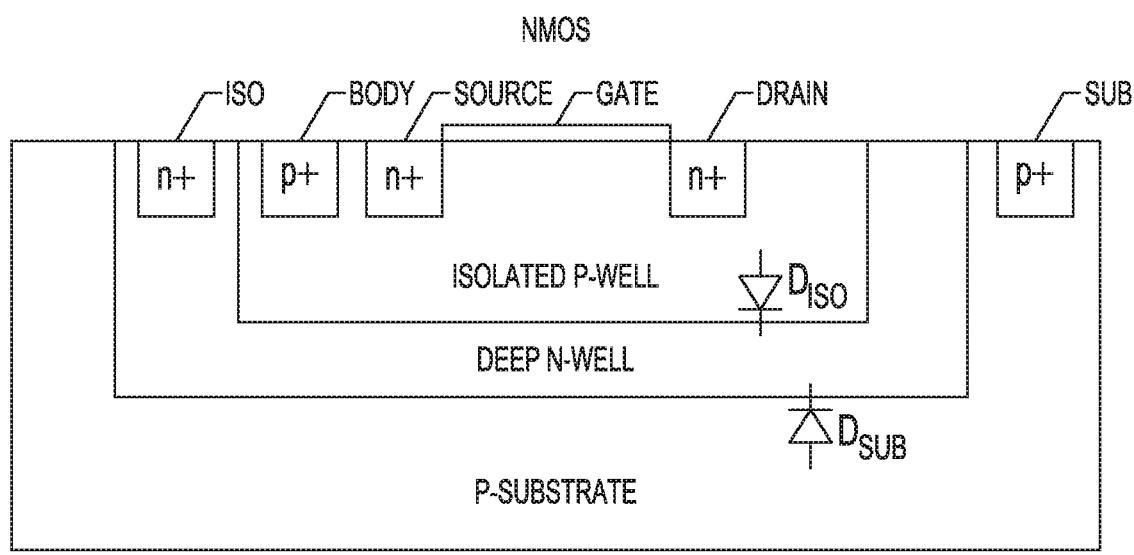
FIG. 6 shows the cross section of a typical isolated n-type metal oxide semiconductor (NMOS) device.

For fabrication technology using a p-type substrate, the NMOS devices (M1a-M7a and M1b-M7b) are isolated with n-type material to separate the NMOS body from the substrate. This n-type material that isolates the substrate from the NMOS body is commonly referred to as the "isolation." FIG. 6 shows the cross section of a typical isolated NMOS device. The NMOS device is sitting surrounded by an n-type material (deep n-well), which isolates the NMOS device from the p-substrate. In normal biasing condition, the p-substrate (sub) is always biased at a lower voltage than the deep n-well (iso) such that the junction diode ($D_{sub}$) between the deep n-Well and p-Substrate is reverse biased. The body of the NMOS device is the isolated p-well. The body of the NMOS device should be at an equal or lower voltage than the deep n-well (iso) to prevent forward biasing the junction diode ($D_{iso}$) between the isolated p-well (body) and deep n-well (iso) during normal operation.

When an isolated NMOS device such as the one shown in FIG. 6 is used in a current sensor circuit such as the one shown in FIG. 5, it is helpful to pay special attention to the biasing of the isolation (iso) of the NMOS device because the leakage of the junction diode ($D_{iso}$) can contribute to the error in the current monitor output. This is because any leakage current in the junction diode ($D_{iso}$) will flow into the body of the NMOS devices M1b-M7b. The current iload is equal to the sum of all the current in the shunt resistors Rs1-Rs7 and all the isolation-to-body junction diode ($D_{iso}$) leakage currents of NMOS devices M1b-M7b. The leakage current of $D_{iso}$ depends on the reverse bias voltage; the greater the reverse bias voltage, the larger leakage current becomes. For the current sensor circuit in FIG. 5, the isolation to the NMOS devices (M1b-M7b and M1a-M7a) should be biased at the same voltage as its body and source to minimize the junction diode ($D_{iso}$) reverse bias. One way to achieve this is by connecting the isolation (iso) of the NMOS (M1b-M7b and M1a-M7a) to its drain; when the NMOS (M1b-M7b) are off, amplifier A2 will drive the drain, isolation of the off NMOS (M1b-M7b) to its source through the switches (S1c-S7c). The leakage current of the junction diode ($D_{sub}$) between the isolation (iso) and substrate (sub) will be provided by drive amplifier A2, and because this leakage current does not add to iload, it will not affect the accuracy of the current monitor output.

Figure 7:
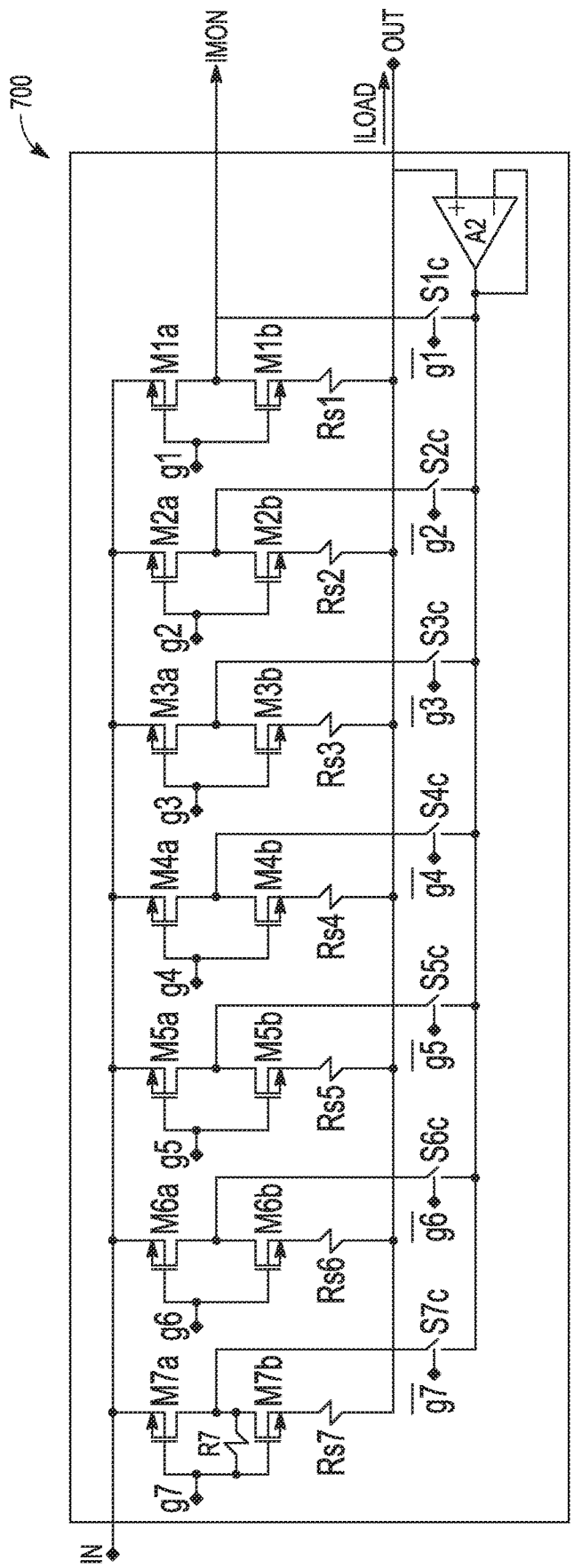
FIG. 7 shows an example of a multi-ranging current sensor circuit.

FIG. 7 shows an example of a multi-ranging current sensor circuit 700 like the one in the example of FIG. 5 with additional protection circuitry to clamp the differential voltage between the IN and OUT terminals of the circuit. A clamp resistor R7 (or other clamping resistive circuit element) is added to the circuit, with its terminals connected to the drain and the source of the back-to-back NMOS devices M7a and M7b for the highest iload current range. The gate control signal for gate connection g7 comes from circuitry not shown in FIG. 7. When Rs7 conducts the iload current, g7 is pulled high relative to the sources to turn on NMOS devices M7a and M7b. When NMOS devices M7a and M7b need to be off to block current through Rs7, the circuitry driving g7 becomes high impedance. This allows the gates connected to g7 to be pulled down to the drains by resistor R7. This configuration allows NMOS devices M7a and M7b to be clamped to the differential voltage between the IN and OUT terminals.

As an example to illustrate the operation of the clamp circuit in FIG. 7, assume the NMOS devices M1a-M7a and M1b-M7b are initially off and a positive iload current is pushing into the IN terminal. Because all the back-to-back NMOS are off, the IN terminal node is being pulled up by the positive current. The potential of the IN terminal continues to increase until the differential voltage between the IN and OUT terminals is equal to the forward diode voltage of the body diode of device M7a plus the threshold voltage of device M7b. As the IN terminal voltage increases, the body diode of M7a becomes forward biased and it pulls up the gate of M7b with it through clamp resistor R7. When the gate-source voltage (Vgs) of M7b is greater than the threshold voltage, current begins to flow from the IN terminal to the OUT terminal through the body diode of M7a, the channel of M7b, and resistor Rs7. With the clamp circuitry, the differential voltage between the IN terminal and the OUT terminal is limited to $Vd_{M7a}+Vgs_{M7b}+IR$, where $Vd_{M7a}$ is forward diode voltage of the body diode of device M7a, $Vgs_{M7b}$ is the gate-source voltage of device M7b, and IR is the voltage drop across the shunt resistor Rs7.

When the back-to-back connected NMOS devices are initially off and a negative iload current pulls down on the IN terminal, the voltage at the IN terminal starts to decrease. As the IN terminal voltage continues to decrease, the body diode of device M7b eventually becomes forward biased and pulls up on the gate of device M7a through clamp resistor R7 until the Vgs of M7a is greater than the threshold voltage. When this happens, current begins to flow from the OUT terminal to the IN terminal through resistor Rs7, the body diode of M7b, and the channel of M7a. This limits the differential voltage between the OUT and IN terminals to $Vd_{M7b}+Vgs_{M7a}+IR$, where $Vd_{M7b}$ is the forward diode voltage of the body diode of M7b, $Vgs_{M7a}$ is the gate-source voltage of M7a, and IR is the voltage drop across the shunt resistor Rs7.

The clamp circuit can protect the shunt resistors and the back-to-back NMOS (M1a-M7b and M1b-M7b) from damage by limiting the maximum differential voltage between the IN terminal and the OUT terminal in both directions. Because devices M7a, M7b, and Rs7 are used for the highest current sense range, their current handling capability makes it advantageous to use them as clamp devices to limit the differential IN-OUT voltage.

Figure 8:
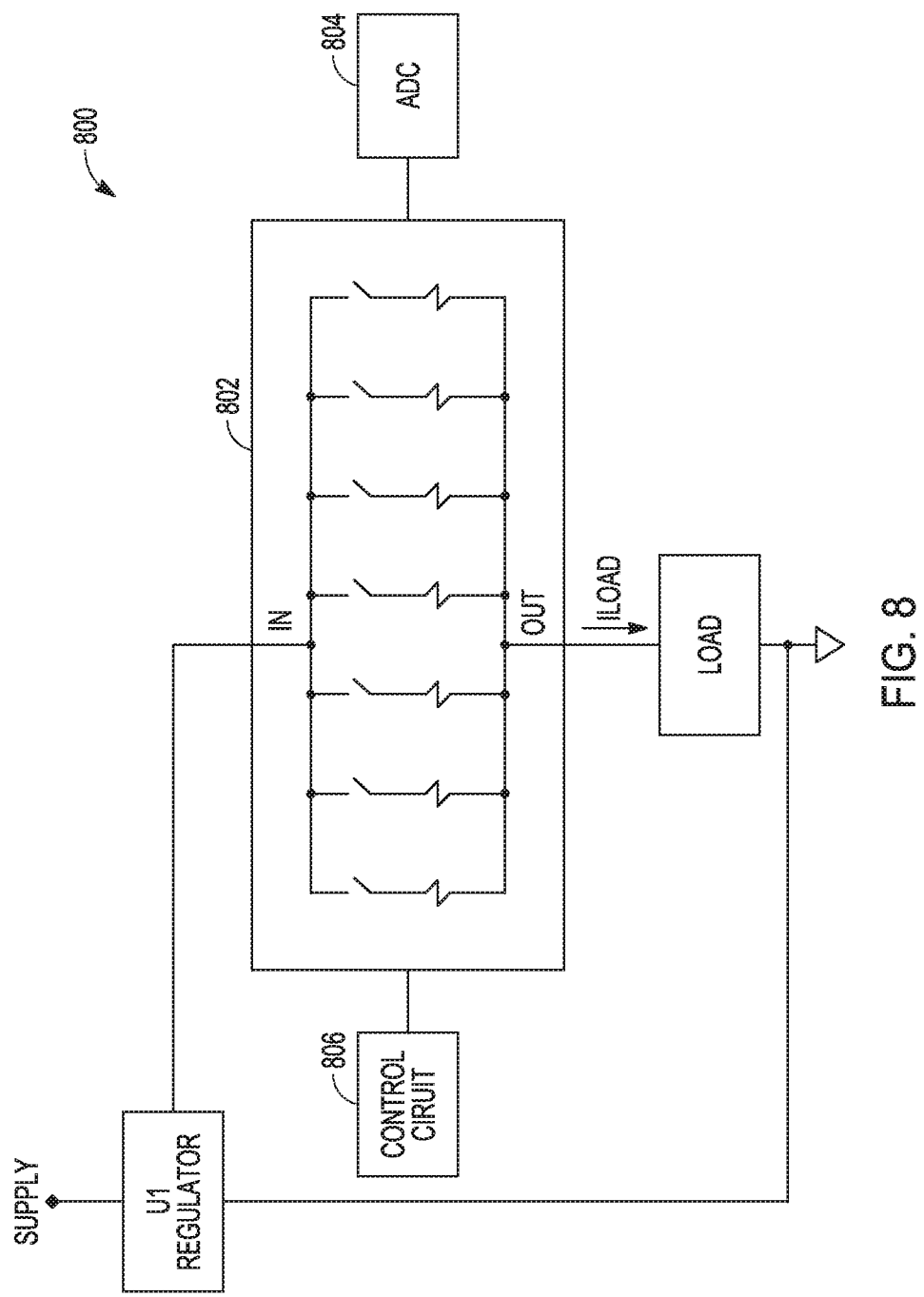
FIG. 8 is a block diagram of an example of a current monitoring system.

FIG. 8 is a block diagram of an example of a current monitoring system 800 where a multi-ranging current monitor circuit 802 is used to monitor load current. The circuit Load can be any electric load such as a rechargeable battery or an electric motor. The current monitor circuit 802 passes the current from the IN terminal to the OUT terminal using multiple shunt resistors. Depending on the magnitude of the load current, one of the shunt resistors conducts the load current. The IMON terminal outputs a signal that is indicative of the magnitude and polarity of the iload current. The IMON terminal may be connected to the output of a sense amplifier and the signal IMON can be in the form of a voltage output, or a current output, etc. The system 800 may include an analog-to-digital converter (ADC) circuit 804 to provide a digital output indicating the magnitude of the load current.

Regulator U1 draws power from the circuit Supply terminal and drives the IN terminal of the current monitor circuit 802. When the Regulator U1 is sourcing current to the load, the load current flows from the Supply terminal to the Load through the Regulator U1 and current monitor circuit 802. In some applications, the regulator U1 can discharge the load. When the load is discharged, current flows from the Load to ground through the current monitor circuit and the Regulator U1. The Regulator U1 can be a linear regulator, a switching converter regulator, or other type of regulator. The current range of the current monitor circuit 802 can be changed manually by user inputs to set the switches to select a shunt resistor for the current range. In some aspects, a control circuit 806 includes logic circuitry to automatically select a shunt resistor according to the magnitude of the sensed load current. One or more comparator circuits can be used to detect the magnitude of the sensed load current and the logic circuitry enables a combination of switches to select the appropriate shunt resistor. If the multi-ranging current monitor circuit 802 includes the ADC circuit 804 the control circuit may recurrently (e.g., periodically) initiate a conversion by the ADC circuit of a voltage sensed across the resistive circuit element by the sense amplifier A1. The control circuit 806 may change the shunt resistor if the magnitude of the sensed current moves to a new current range as determined by the comparators.

Figure 9:
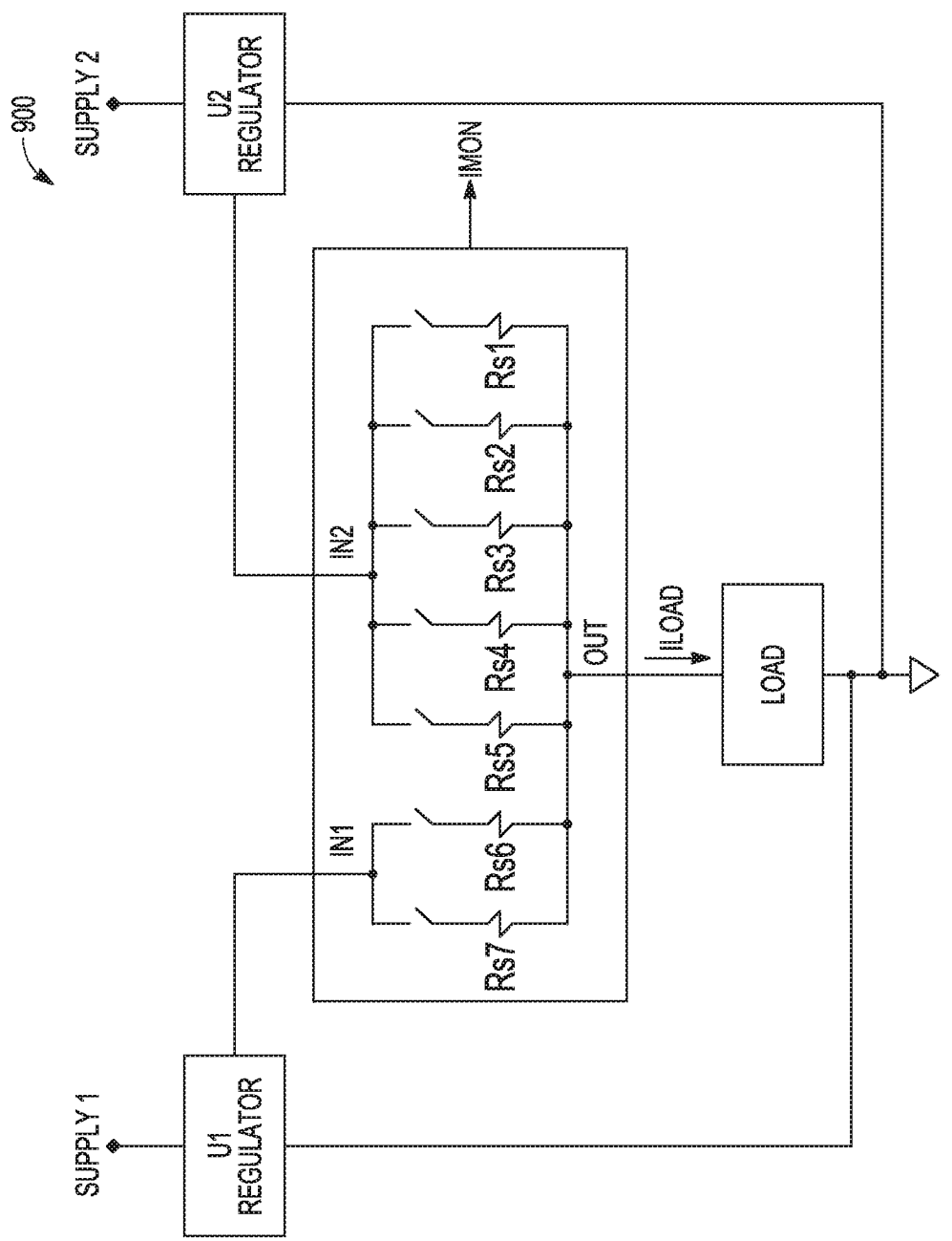
FIG. 9 is a block diagram of another example of a current monitoring system.

FIG. 9 is a block diagram of another example of a current monitoring system 900 where a multi-ranging current monitor circuit 902 is used to monitor load current. In this system, there are two Regulators U1 and U2 powered by circuit supply terminals Supply1 and Supply2. Either circuit supply can supply the load current (iload) to the circuit Load through the multi-ranging current monitor circuit 902. The current monitor circuit has two input terminals IN1 and IN2. The shunt resistors in the multi-ranging current monitor circuit 902 are divided into 2 groups, with shunt resistors Rs6 and Rs7 (in FIG. 5) connecting to the output of Regulator U1 through the IN1 terminal, and the other shunt resistors Rs5-Rs1 connecting to the output of Regulator U2 through the IN2 terminal. When Regulator U1 is driving the load current, one of the shunt resistors of the first group (Rs7 or Rs6) conducts the current to the Load. When Regulator U2 is driving the load current, one of the shunt resistors of the second group (Rs1-Rs5) conducts the current to the Load. In certain aspects, a DC-DC converter may be used for Regulator U1 to provide the load current in the higher current range, and a linear type of regulator may be used for Regulator U2 to provide the load current in the lower current range. A DC-DC converter is good for providing higher output power with high efficiency, whereas a linear regulator is ideal for lower power output with better noise performance.

Figure 10:
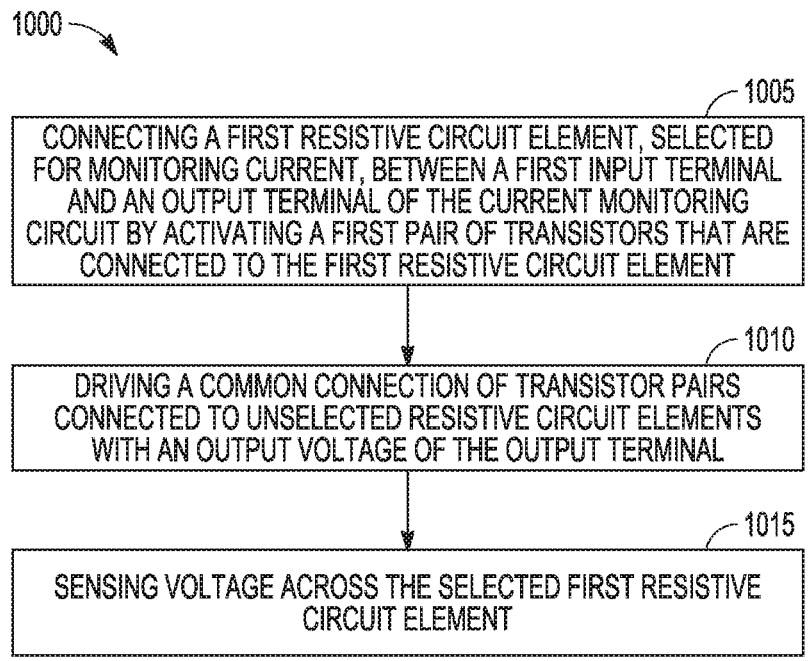
FIG. 10 is a flow diagram of a method of operating a multi-ranging current monitoring circuit of an electronic system.

For completeness, FIG. 10 is a flow diagram of a method of operating a multi-ranging current monitoring circuit of an electronic system. At 1005, a first resistive circuit element is selected for monitoring current and connected between an input terminal and an output terminal of the current monitoring circuit by activating a first pair of transistors that are connected to the resistive circuit element. The pair of transistors are connected in series and the resistive circuit element can be a shunt resistor connected in series to the pair of transistors.

At 1010, a common connection of the transistor pairs connected to unselected resistive circuit elements are driven with an output voltage of the output terminal. The transistors may be either NMOS or PMOS devices and the common connection can be either a common drain connection or a common source connection. At 1015, the voltage across the selected resistive circuit element is sensed and a signal representative of the monitored current is generated. The generated output signal may be quantified using an ADC circuit.

The devices, systems, and methods described herein provide a leakage current compensation technique that resolves the accuracy issue in multi-range current monitor circuits due to leakage current from electronic switches. This technique uses back-to-back NMOS devices as the series switches to block and pass current through the shunt resistors. The leakage current of the back-to-back NMOS is nullified by driving the drain-source voltage of one of the back-to-back NMOS to 0V. A clamp circuit can be used to protect the series connected devices and the shunt resistors. This leakage compensation technique can be used in systems where the load current is provided by one or more regulators.

Additional Description and Aspects

A first Aspect (Aspect 1) includes subject matter (such as a current sensor circuit) comprising multiple resistive circuit elements arranged between at least one input terminal of the current sensor circuit and an output terminal, wherein the resistive circuit elements have different values of electrical resistance; a first plurality of switching circuits coupled between the input terminal and the resistive circuit elements, wherein each switching circuit of the first plurality of switching circuits includes a pair of transistors connected in series; at least one drive amplifier including an output and an input connected to the output terminal; and a second plurality of switching circuits, each switching circuit including a first switch terminal coupled to the at least one drive amplifier output and a second switch terminal coupled to a common connection of a pair of transistors of the first plurality of switching circuits.

In Aspect 2, the subject matter of Aspect 1 optionally includes a clamping resistive circuit element coupled between the common drain connection of at least one transistor pair of the first plurality of switching circuits and a common gate connection of the at least one transistor pair.

In Aspect 3, the subject matter of one or both of Aspects 1 and 2 optionally includes at least one sense amplifier configured to sense a voltage across a resistive circuit element of the multiple resistive circuit elements and output an electrical signal representative of a load current.

In Aspect 4, the subject matter of one or any combination of Aspects 1-3 optionally includes a sense amplifier including a first input coupled to the output terminal, and a third plurality of switching circuits coupled to the multiple resistive circuit elements, each switching circuit including a first switch terminal coupled to a resistive circuit element and a second switch terminal coupled to a second input of the sense amplifier.

In Aspect 5, the subject matter of Aspect 4 optionally includes an analog-to-digital converter (ADC) circuit coupled to an output of the sense amplifier.

In Aspect 6, the subject matter of Aspect 5 optionally includes multiple input terminals, wherein a portion of the multiple resistive circuit elements are arranged between each input terminal of the multiple input terminals and the output terminal; and a control circuit configured to recurrently connect a resistive circuit element to an input terminal of the multiple input terminals and initiate a conversion by the ADC circuit of a voltage sensed across the resistive circuit element by the sense amplifier.

In Aspect 7, the subject matter of one or any combination of Aspects 1-6 optionally includes multiple drive amplifiers each connected to a portion of the switching circuits of the second plurality of switching circuits.

In Aspect 8, the subject matter of one or any combination of Aspects 1-7 optionally includes at least one comparator circuit configured to determine a range of current received at the input terminal and to select a resistive circuit element of the multiple resistive circuit elements by enabling a first switching circuit of the first plurality of switching circuits and a second switching circuit of the second plurality of switching circuits according to the determined range of current.

Aspect 9 include subject matter (such as a method of operating a current monitoring circuit of an electronic system) or can optionally be combined with one or any combination of Aspects 1-8 to include such subject matter, comprising connecting a first resistive circuit element, selected for monitoring current, between a first input terminal and an output terminal of the current monitoring circuit by activating a first pair of transistors that are connected to the first resistive circuit element, wherein the pair of transistors are connected in series; driving a common connection of transistor pairs connected to unselected resistive circuit elements with an output voltage of the output terminal; and sensing voltage across the selected first resistive circuit element.

In Aspect 10, the subject matter of Aspect 9 optionally includes limiting the voltage between the input terminal and the output terminal to a maximum voltage.

In Aspect 11, the subject matter of Aspect 10 optionally includes clamping the voltage between the input terminal and the output terminal using a resistor connected between the common connection of a transistor pair and a common gate connection of the transistor pair.

In Aspect 12, the subject matter of one or any combination of Aspects 9-11 optionally includes determining a current range of the current to be monitored using the current monitoring circuit; and selecting the resistive circuit element according to the determined current range.

In Aspect 13, the subject matter of one or any combination of Aspects 9-12 optionally includes generating an electrical signal representative of a load current of the electronic system.

In Aspect 14, the subject matter of one or any combination of Aspects 9-13 optionally includes quantifying the sensed voltage using an ADC circuit.

In Aspect 15, the subject matter of one or any combination of Aspects 9-14 optionally includes disconnecting the first resistive circuit element from the first input terminal; connecting a second resistive circuit element between a second input terminal of the current monitoring circuit and the output terminal by activating a second pair of transistors that are connected to the second resistive circuit element, wherein the second pair of transistors have a common connection; and sensing voltage across the second resistive circuit element.

Aspect 16 includes subject matter (such as an electronic system) or can optionally be combined with one or any combination of Aspects 1-15 to include such subject matter comprising a first circuit supply rail; a circuit load; and a current monitor circuit coupled to the first circuit supply rail and circuit load. The current monitor circuit includes multiple resistive circuit elements arranged between at least one input terminal of the current sensor circuit and an output terminal, wherein the resistive circuit elements have different values of electrical resistance; a first plurality of switching circuits coupled between the at least one input terminal and the resistive circuit elements, wherein each switching circuit of the first plurality of switching circuits includes a pair of transistors connected in series with drain regions of the transistors connected together; at least one drive amplifier including an output and an input connected to the output terminal; a second plurality of switching circuits, each switching circuit including a first switch terminal coupled to the at least one drive amplifier output and a second switch terminal coupled to a common drain connection of a pair of transistors of the first plurality of switching circuits; and a sense amplifier configured to provide an output signal representative of at least a portion of load current to the output terminal.

In Aspect 17, the subject matter of Aspect 16 optionally includes a second circuit supply rail, and at least a first input terminal and a second input terminal.

The first input terminal is coupled to the first circuit supply rail and a first portion of the first plurality of switching circuits, and the second input terminal is coupled to the second circuit supply rail and a second portion of the first plurality of switching circuits.

In Aspect 18, the subject matter of Aspect 17 optionally includes an analog-to-digital converter (ADC) circuit coupled to the sense amplifier; and a control circuit configured to recurrently initiate measurement of sensed current from the first circuit supply rail and sensed current from the second circuit supply rail using ADC circuit.

In Aspect 19, the subject matter of one or any combination of Aspects 16-18 optionally includes a third plurality of switching circuits coupled to the multiple resistive circuit elements, each switching circuit including a first switch terminal coupled to a resistive circuit element and a second switch terminal coupled to a non-inverting input of the sense amplifier. The inverting input of the sense amplifier is coupled to the output terminal.

In Aspect 20, the subject matter of one or any combination of Aspects 16-19 optionally includes a clamping resistive circuit element coupled between the common drain connection of at least one transistor pair of the first plurality of switching circuits and a common gate connection of the at least one transistor pair.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples" or "aspects." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A current sensor circuit comprising:
multiple resistive circuit elements arranged between at least one input terminal of the current sensor circuit and an output terminal, wherein the resistive circuit elements have different values of electrical resistance;
a first plurality of switching circuits coupled between the input terminal and the resistive circuit elements, wherein each switching circuit of the first plurality of switching circuits includes a pair of transistors connected in series;
at least one drive amplifier including an output and an input connected to the output terminal; and
a second plurality of switching circuits, each switching circuit including a first switch terminal coupled to the at least one drive amplifier output and a second switch terminal coupled to a common connection of a pair of transistors of the first plurality of switching circuits.

2. The current sensor circuit of claim 1, including a clamping resistive circuit element coupled between the common drain connection of at least one transistor pair of the first plurality of switching circuits and a common gate connection of the at least one transistor pair.

3. The current sensor circuit of claim 1, including at least one sense amplifier configured to sense a voltage across a resistive circuit element of the multiple resistive circuit elements and output an electrical signal representative of a load current.

4. The current sensor circuit of claim 1, including:
a sense amplifier including a first input coupled to the output terminal; and
a third plurality of switching circuits coupled to the multiple resistive circuit elements, each switching circuit including a first switch terminal coupled to a resistive circuit element and a second switch terminal coupled to a second input of the sense amplifier.

5. The current sensor of claim 4, including an analog-to-digital converter (ADC) circuit coupled to an output of the sense amplifier.

6. The current sensor circuit of claim 5, including:
multiple input terminals, wherein a portion of the multiple resistive circuit elements are arranged between each input terminal of the multiple input terminals and the output terminal; and
a control circuit configured to recurrently connect a resistive circuit element to an input terminal of the multiple input terminals and initiate a conversion by the ADC circuit of a voltage sensed across the resistive circuit element by the sense amplifier.

7. The current sensor circuit of claim 1, including multiple drive amplifiers each connected to a portion of the switching circuits of the second plurality of switching circuits.

8. The current sensor circuit of claim 1, including at least one comparator circuit configured to determine a range of current received at the input terminal and to select a resistive circuit element of the multiple resistive circuit elements by enabling a first switching circuit of the first plurality of switching circuits and a second switching circuit of the second plurality of switching circuits according to the determined range of current.

9. A method of operating a current monitoring circuit of an electronic system, the method comprising:
connecting a first resistive circuit element, selected for monitoring current, between a first input terminal and an output terminal of the current monitoring circuit by activating a first pair of transistors that are connected to the first resistive circuit element, wherein the pair of transistors are connected in series;
driving a common connection of transistor pairs connected to unselected resistive circuit elements with an output voltage of the output terminal; and
sensing voltage across the selected first resistive circuit element.

10. The method of claim 9, including limiting the voltage between the input terminal and the output terminal to a maximum voltage.

11. The method of claim 10, wherein limiting the voltage includes clamping the voltage between the input terminal and the output terminal using a resistor connected between the common connection of a transistor pair and a common gate connection of the transistor pair.

12. The method of claim 9, including:
determining a current range of the current to be monitored using the current monitoring circuit; and
selecting the resistive circuit element according to the determined current range.

13. The method of claim 9, including generating an electrical signal representative of a load current of the electronic system.

14. The method of claim 9, including quantifying the sensed voltage using an analog-to-digital converter (ADC) circuit.

15. The method of claim 9, including:
disconnecting the first resistive circuit element from the first input terminal;
connecting a second resistive circuit element between a second input terminal of the current monitoring circuit and the output terminal by activating a second pair of transistors that are connected to the second resistive circuit element, wherein the second pair of transistors have a common connection; and
sensing voltage across the second resistive circuit element.

16. An electronic system comprising:
a first circuit supply rail;
a circuit load; and
a current monitor circuit coupled to the first circuit supply rail and circuit load, and including:
multiple resistive circuit elements arranged between at least one input terminal of the current sensor circuit and an output terminal, wherein the resistive circuit elements have different values of electrical resistance;
a first plurality of switching circuits coupled between the at least one input terminal and the resistive circuit elements, wherein each switching circuit of the first plurality of switching circuits includes a pair of transistors connected in series with drain regions of the transistors connected together;
at least one drive amplifier including an output and an input connected to the output terminal;
a second plurality of switching circuits, each switching circuit including a first switch terminal coupled to the at least one drive amplifier output and a second switch terminal coupled to a common drain connection of a pair of transistors of the first plurality of switching circuits; and a sense amplifier configured to provide an output signal representative of at least a portion of load current to the output terminal.

17. The electronic system of claim 16, including:

a second circuit supply rail; and at least a first input terminal and a second input terminal;

wherein the first input terminal is coupled to the first circuit supply rail and a first portion of the first plurality of switching circuits, and the second input terminal is coupled to the second circuit supply rail and a second portion of the first plurality of switching circuits.

18. The electronic system of claim 17, including:

an analog-to-digital converter (ADC) circuit coupled to the sense amplifier; and a control circuit configured to recurrently initiate measurement of sensed current from the first circuit supply rail and sensed current from the second circuit supply rail using ADC circuit.

19. The electronic system of claim 16, including:

a third plurality of switching circuits coupled to the multiple resistive circuit elements, each switching circuit including a first switch terminal coupled to a resistive circuit element and a second switch terminal coupled to a non-inverting input of the sense amplifier; and wherein an inverting input of the sense amplifier is coupled to the output terminal.

20. The electronic system of claim 16, including a clamping resistive circuit element coupled between the common drain connection of at least one transistor pair of the first plurality of switching circuits and a common gate connection of the at least one transistor pair.

* * * * *

UNITED STATES PATENT AND TRADEMARK OFFICE
CERTIFICATE OF CORRECTION

PATENT NO. : 11,499,995 B2
APPLICATION NO. : 17/079845
DATED : November 15, 2022
INVENTOR(S) : Hio Leong Chao It is certified that error appears in the above-identified patent and that said Letters Patent is hereby corrected as shown below:

In the Claims

In Column 13, Line 47, in Claim 5, after "current sensor", insert --circuit--

Signed and Sealed this
Twenty-ninth Day of August, 2023

Katherine Kelly Vidal
*Director of the United States Patent and Trademark Office*